(12) United States Patent
Sato et al.

(10) Patent No.: US 6,771,041 B2
(45) Date of Patent: *Aug. 3, 2004

(54) CELL VOLTAGE MEASURING DEVICE FOR FUEL CELL

(75) Inventors: Masahiko Sato, Utsunomiya (JP);
Hideaki Kikuchi, Kawachi-gun (JP);
Toshiaki Ariyoshi, Utsunomiya (JP);
Yosuke Fujii, Kawachi-gun (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/236,110

(22) Filed: Sep. 6, 2002

(65) Prior Publication Data

US 2003/0048090 A1 Mar. 13, 2003

(30) Foreign Application Priority Data

Sep. 10, 2001 (JP) ........................................ 2001-274089

(51) Int. Cl.[7] .......................... H01M 10/44; H01M 2/10
(52) U.S. Cl. ...................................... 320/101; 429/100
(58) Field of Search ............................ 320/101; 429/27, 429/40, 45, 94, 127, 131–133, 137, 140, 141

(56) References Cited

U.S. PATENT DOCUMENTS 3,960,598 A * 6/1976 Kohlmuller ................... 429/39

FOREIGN PATENT DOCUMENTS

JP 09-283166 10/1997

* cited by examiner

*Primary Examiner*—Pia Tibbits
(74) *Attorney, Agent, or Firm*—Lahive & Cockfield, LLP; Anthony A. Laurentano

(57) ABSTRACT

A cell voltage measuring device for a fuel cell includes a terminal member to be connected to a separator of the fuel cell, the terminal member including a first end and a second end, and a voltage measuring unit which measures cell voltage of the fuel cell through the terminal member. The first end of the terminal member is fixed to the voltage measuring unit, and the second end of the terminal member makes contact with the separator, and an elastic portion is provided between the first end and the second end of the terminal member. The cell voltage measuring device may further includes a holder member which is capable of maintaining a state in which the second end of the terminal member is separated from each other, and the holder member is movably attached in a stacking direction of the separator with respect to the voltage measuring unit.

25 Claims, 12 Drawing Sheets

CELL VOLTAGE MEASURING DEVICE FOR FUEL CELL

BACKGROUND OF THE INVENTION

1. Field of the Invention

The present invention relates to a cell voltage measuring device. More specifically, the present invention relates to a cell voltage measuring device which measures the cell voltage of a fuel cell.

2. Description of Related Art

FIG. 12 shows an example of conventional fuel cells which may be mounted in vehicles, such as fuel cell powered vehicles. In the fuel cell shown in FIG. 12, a plurality of cell units 95 are stacked, each of which includes a solid polymer electrolyte membrane 91 formed by, for instance, a solid polymer ion exchange membrane, sandwiched by an anode 92 and a cathode 93, and a pair of separators 94 and 94 holding the electrodes 92 and 93. Also, a fuel gas passage 96 which supplies a fuel gas (for instance, hydrogen gas), and an oxidant gas passage 97 which supplies an oxidant gas (for instance, air) are provided for each of the cell units 95.

In a fuel cell of this type, hydrogen ions generated at the anode 92 by a catalytic reaction move to the cathode 93 by passing through the solid polymer electrolyte membrane 91, and generate electric power at the cathode 93 by causing an electrochemical reaction with oxygen.

In a fuel cell having the above structure, it is necessary to control a power generation state of each cell unit 95 in order to detect abnormal cell units (i.e., malfunctioning or deteriorating cell units) as quickly as possible. For this reason, voltage (hereinafter referred to as cell voltage) of each cell unit 95 is measured.

In order to measure the cell voltage, the pair of separators 94 and 94 of each cell unit 95 are connected to a voltage detection circuit 101 of an electrical control unit (ECU) 100.

Japanese Unexamined Patent Application, First Publication No. Hei 9-283166 discloses a technique relating to a connection structure of a harness 102, which is connected to the voltage detection circuit 101, with the separator 94. In the connection structure described in the above publication, a hole used for attachment to a terminal is formed for each separator, and an output terminal provided with an end of each harness is inserted into the hole to make a connection.

Also, in another connection structure, an output terminal for measuring voltage is provided with a separator, and a connector is provided with an end of each harness so that the connector is connected to the output terminal of each of the separators.

However, in the former conventional connection structure, the output terminal must be inserted into the holes of the separator one by one to establish a connection, and in the latter conventional connection structure, the connector must be connected to the output terminal of each separator one by one. Accordingly, in the cell stack formed by stacking a few tens to a few hundreds of cell units 95, the connection process become very complicated for both of the two types of conventional connection structure, and there are problems in that errors in connection occur or a connection portion tends to be easily disconnected due to defective connection.

Also, since a harness which corresponds to each of the separators 94 is required in any of the conventional connection structures, the number of harnesses required becomes significant, and this is a drawback for decreasing the size and the weight of the device. Moreover, there is a problem in that each of the harnesses used may be tangled in a complicated manner.

SUMMARY OF THE INVENTION

Accordingly, an object of the invention is to provide a cell voltage measuring device for a fuel cell which enables an easy connection operation and reduction in the size and weight of the device by connecting a separator of the fuel cell with a voltage measuring means without using a harness.

In order to achieve the above object, the present invention provides a cell voltage measuring device for a fuel cell including a terminal member to be connected to a separator of the fuel cell, the terminal member including a first end and a second end, and a voltage measuring unit, such as a control unit which measures cell voltage of the fuel cell through the terminal member, wherein the first end, such as a base portion, of the terminal member is fixed to the voltage measuring unit, and the second end, such as a connection portion, of the terminal member makes contact with the separator, and an elastic portion, such as a spring arm is provided between the first end and the second end of the terminal member.

According to the cell voltage measuring device described above, since the terminal member and the separator can be connected without using harness, the connection process becomes easy, and the size and weight of the device can be decreased. Also, since the positional error between the terminal member and the separator to which the terminal member makes contact can be absorbed by the elastic portion, it becomes possible to securely contact the terminal member with the separator during the assembly. Moreover, when the separator is displaced due to heat generated by the fuel cell in the stacking direction thereof, the displacement can be absorbed by the elastic portion so as to prevent an excessive load from being applied to the terminal member. Accordingly, it becomes possible to prevent the terminal member from being damaged.

In accordance with another aspect of the invention, the cell voltage measuring device for a fuel cell further includes a terminal cover, which covers at least a part of the terminal member.

According to the above cell voltage measuring device, since it becomes possible to avoid foreign materials, such as water, attaching to the terminal member, electrical shorts among the terminal members can be prevented. Therefore, the reliability of the cell voltage detection can be improved.

In yet another aspect of the invention, the cell voltage measuring device for a fuel cell further includes a holder member, which is capable of maintaining a state in which the second end of the terminal member is separated from each other, wherein the holder member is movably attached in a stacking direction of the separator with respect to the voltage measuring unit.

In yet another aspect of the invention, the cell voltage measuring device for a fuel cell further includes a holder member, which is capable of maintaining a state in which the second end of the terminal member is separated from each other, wherein the holder member is movably attached to the terminal cover in a stacking direction of the separator with respect to the voltage measuring unit.

In yet another aspect of the invention, the cell voltage measuring device for a fuel cell further includes a holder member, which is capable of maintaining a state in which the second ends of the terminal members is separated from each other, wherein the holder member is attached to the voltage measuring unit in a movable manner in a stacking direction of the separator with respect to the voltage measuring unit.

According to the above cell voltage measuring device, it becomes possible to make the second end of the terminal member follow the movement of the separator in the stacking direction while maintaining the electrically separated state of the second end of the terminal members. Accordingly, generation of electrical shorts among the terminal members can be assuredly prevented even when the second ends of the terminal members are displaced in the stacking direction of the separator, and the reliability of cell voltage measurement is improved.

The present invention also provides a cell voltage measuring device, such as a cell measuring device, for a fuel cell including a terminal member to be connected to a separator of the fuel cell, the terminal member comprising a first terminal portion and a second terminal portion, and the second terminal portion including a first end, such as a coupling portion, and a second end, such as a connection portion and a voltage measuring unit (for instance, a control unit 31 in the second embodiment described later) which measures cell voltage of the fuel cell through the terminal, wherein the first terminal portion is fixed to the voltage measuring unit, and the first end of the second terminal portion is rotatably supported by the first terminal portion, and the second end of the second terminal portion makes contact with the separator, and an elastic portion, such as a spring arm 45 is provided between the first end and the second end of the second terminal portion.

According to the above cell voltage measuring device, excellent effects can be obtained in that the second terminal portion can be easily contacted or separated from the separator by rotating the second terminal portion with respect to the first terminal portion. Also, since the second terminal portion can be contacted to the separator without using the harness, the connection operation becomes easy and the size and weight of the device can be decreased. Moreover, since the positional error between the second terminal portion and the separator to which the second terminal portion makes contact can be absorbed by the elastic portion, it becomes possible to securely contact the second terminal portion with the separator during the assembly. Further, when the separator is displaced due to heat generated by the fuel cell in the stacking direction thereof, the displacement can be absorbed by the elastic portion so as to prevent an excessive load from being applied to the first terminal portion and the second terminal portion. Accordingly, it becomes possible to prevent the first terminal portion and the second terminal portion from being damaged.

In accordance with another aspect of the invention, the above cell voltage measuring device for a fuel cell further includes a terminal cover which covers at least a part of the terminal member.

According to the above cell voltage measuring device, since it becomes possible to avoid foreign materials, such as water, attaching to the terminal member, and electrical shorts among the terminal members can be prevented. Therefore, the reliability of the cell voltage measurement can be improved.

In yet another aspect of the invention, the above cell voltage measuring device for a fuel cell further includes a holder member which is capable of maintaining a state in which the second ends of the second terminal portions are separated from each other, wherein the holder member is movably attached in a stacking direction of the separator with respect to the voltage measuring unit.

In yet another aspect of the invention, the cell voltage measuring device for a fuel cell further includes a holder member which is capable of maintaining a state in which the second end of the second terminal portion is separated from each other, wherein the holder member is attached to the terminal cover in a movable manner in a stacking direction of the separator with respect to the voltage measuring unit.

In yet another aspect of the invention, the cell voltage measuring device for a fuel cell further includes a holder member which is capable of maintaining a state in which the second end of the terminal is separated from each other, wherein the holder member is attached to the voltage measuring unit in a movable manner in a stacking direction of the separator with respect to the voltage measuring unit.

According to the above cell voltage measuring device, it becomes possible to make the second end of the second terminal portion to follow the movement of the separator in the stacking direction while maintaining the electrically separated state of the second end of the second terminal portions. Accordingly, generation of electrical shorts among the terminal members can be assuredly prevented even when the second end of the second terminal portions are displaced in the stacking direction of the separator, and the reliability in cell voltage detection is improved.

BRIEF DESCRIPTION OF THE DRAWINGS

Some of the features and advantages of the invention have been described, and others will become apparent from the detailed description which follows and from the accompanying drawings, in which.

DETAILED DESCRIPTION OF THE INVENTION

The invention summarized above and defined by the enumerated claims may be better understood by referring to the following detailed description, which should be read with reference to the accompanying drawings. This detailed description of particular preferred embodiments, set out below to enable one to build and use particular implementations of the invention, is not intended to limit the enumerated claims, but to serve as particular examples thereof.

Hereinafter, embodiments of the cell voltage measuring device for a fuel cell according to the present invention will be described with reference to FIGS. 1 through 11.

Figure 1:
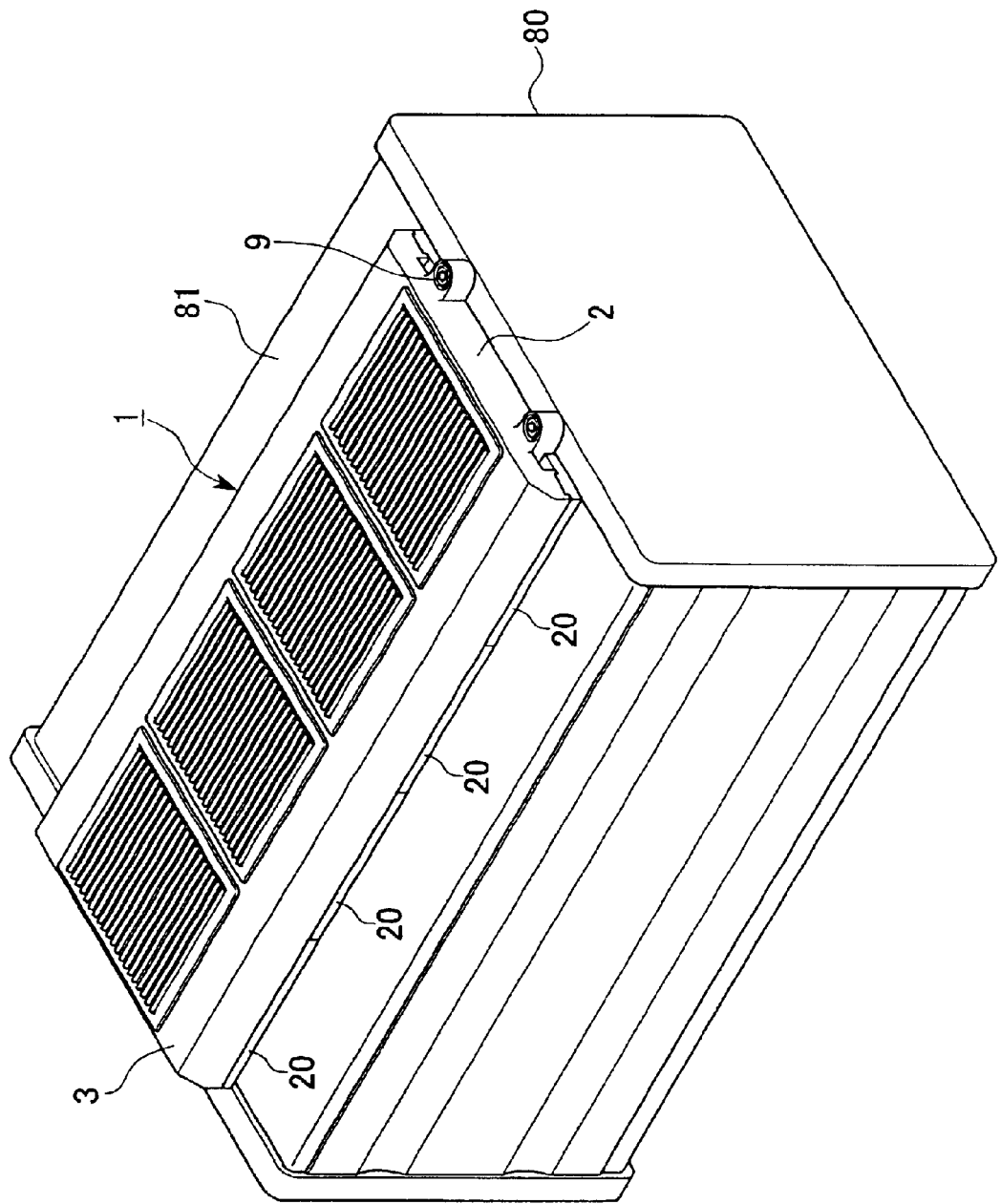
FIG. 1 is a diagram showing a perspective view of an assembly of a cell voltage measuring device according to the first embodiment of the present invention and a fuel cell provided therewith.
Figure 2:
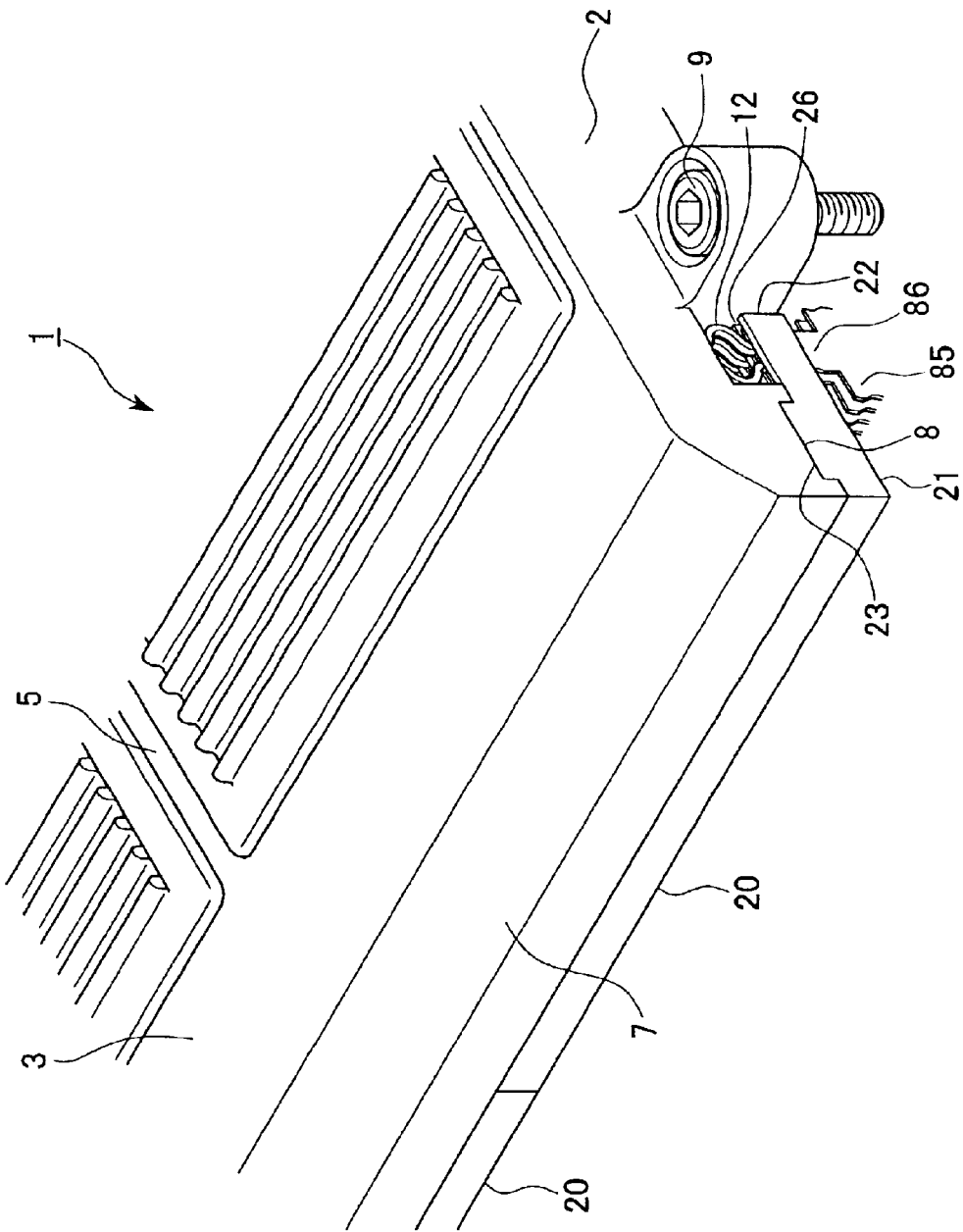
FIG. 2 is a diagram showing an enlarged perspective view of an appearance of main parts of the cell voltage measuring device according to the first embodiment of the present invention.
Figure 3:
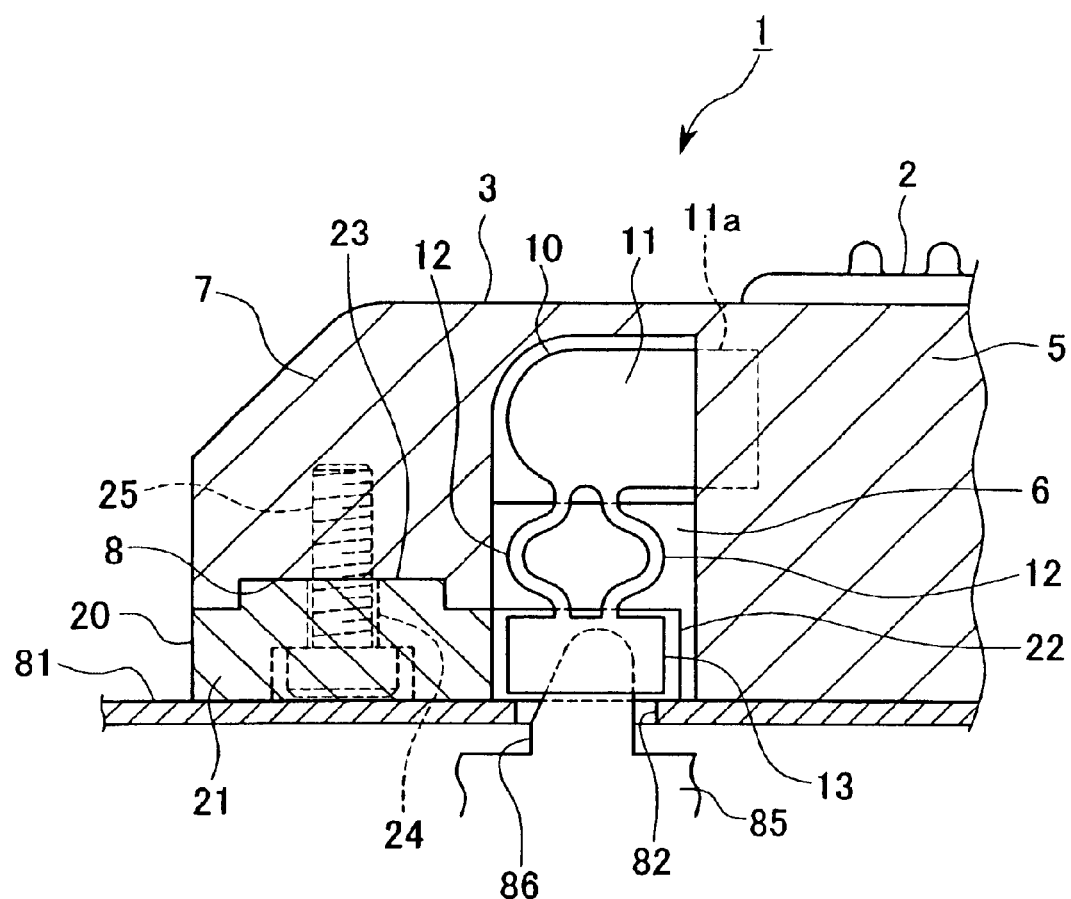
FIG. 3 is a diagram showing a cross-sectional view of the cell voltage measuring device according to the first embodiment of the present invention.
Figure 4:
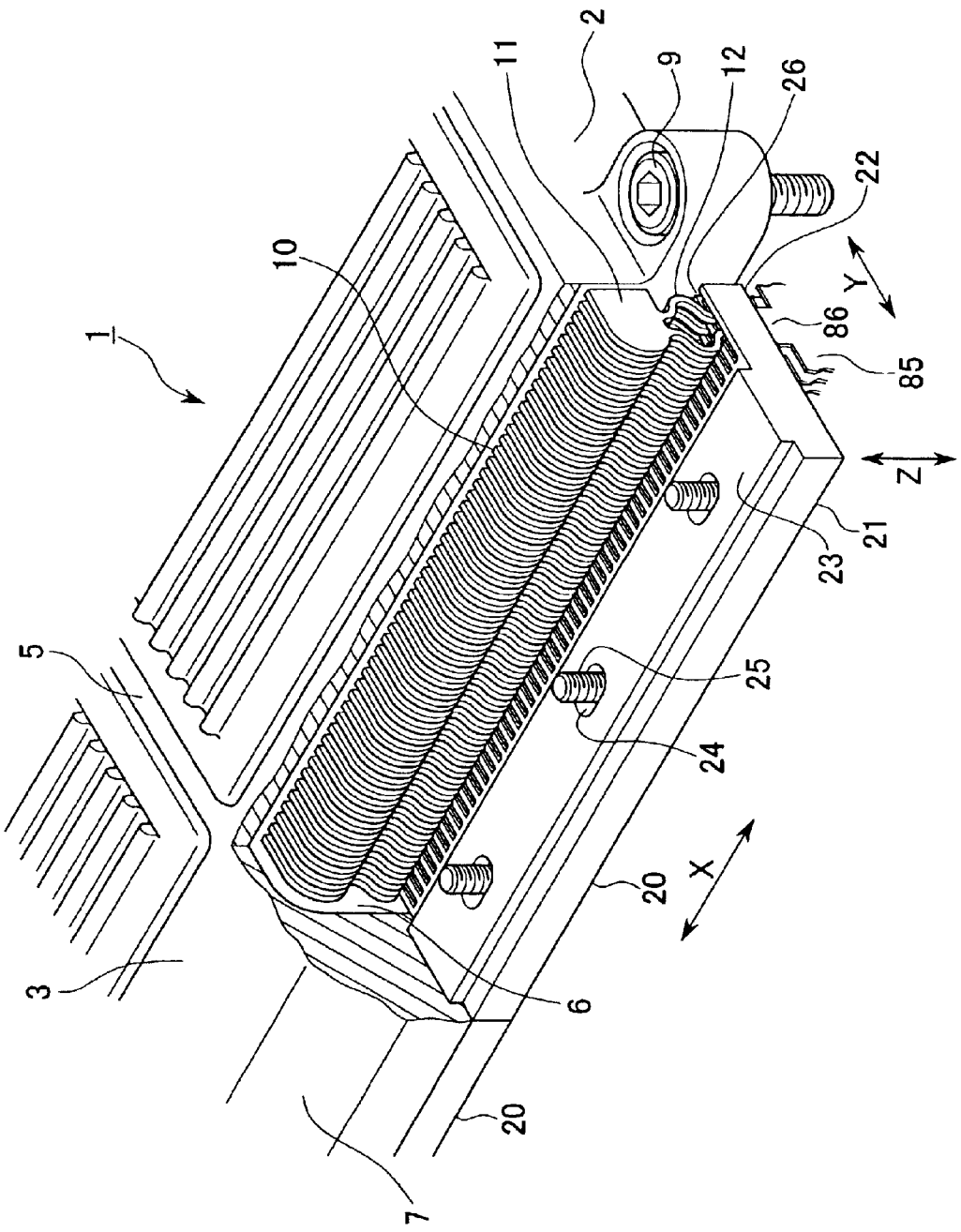
FIG. 4 is a diagram showing an enlarged cutout view of the main parts of the cell voltage measuring device according to the first embodiment of the present invention.

First Embodiment:

The first embodiment according to the present invention will be described with reference to FIGS. 1 through 4. FIG. 1 is a diagram showing a perspective view of an assembly of a cell voltage measuring device 1 mounted on a fuel cell cover 80 in which stacks (fuel cell) are accommodated. FIG. 2 is a diagram showing an enlarged perspective view of an appearance of the main parts of the cell voltage measuring device 1. FIG. 3 is a diagram showing a cross-sectional view of the cell voltage measuring device 1 shown in FIG. 2. FIG. 4 is a diagram showing an enlarged cutout view of a part of the main parts of the cell voltage measuring device 1.

As shown in FIGS. 1 and 3, the cell voltage measuring device 1 is provided on a top plate 81 of the fuel cell cover 80. The fuel cell cover 80 has a substantially rectangular parallelepiped shape, and elongated terminal openings 82 and 82 are formed at two edges of the top plate 81.

The basic structure of the stack contained in the fuel cell cover 80 is substantially the same as the one in prior art, and thus the explanation thereof is omitted. A separator 85 of the stack in this embodiment is made by press molding a metal plate, and an output terminal 86 for measuring the cell voltage is extended upwardly at the upper side end portion of the separator 85. Note that in this embodiment, the output terminal 86 of the separator 85 is alternately disposed at the right end portion side and the left end portion of the separator 85 in the stacking order of the separators 85. Also, the output terminals 86 at the right end portion and the output terminals 86 at the left end portion penetrate through the terminal openings 82 at the right hand side and the left hand side, respectively, which are formed in the top plate 81 of the fuel cell cover 80, and are protruded upwardly therefrom. Note that FIG. 3 shows a portion which is connected to the output terminal 86 at the left end portion side of the separator 85.

The cell voltage measuring device 1 includes a control unit (a voltage measuring means) 2, a terminal cover 3, and a holder 20. The control unit 2 is disposed between the terminal openings 82 and 82 at the top plate 81 of the fuel cell cover 80. The terminal cover 3 is provided so as to extend from both side portions of the control unit 2 to the outside of the respective terminal opening 82. The holder 20 is disposed at a respective end of the lower surface of the terminal cover 3. The control unit 2 accommodates a voltage detection circuit for detecting the cell voltage of each cell unit in a case portion 5 thereof, and the case portion 5 is integrally formed with the terminal cover 3 using an insulating material (for instance, a resin) in this embodiment. However, it is possible to separately form the terminal cover 3 and the case portion 5 so that the terminal cover 3 may be detachably attached to the case portion 5.

The terminal cover 3 includes a terminal accommodating space 6 provided above the terminal opening 82, and a thick supporting portion 7 located outside of the terminal accommodating space 6. The terminal accommodating space 6 is provided over substantially the entire length of the terminal cover 3 along the stacking direction of the separators 85 (i.e., X direction shown in FIG. 4). In the terminal accommodating space 6, a number of terminals 10 which extend from the side surface of the control unit 2 are contained. Also, a fitting concave portion 8 which extends along the stacking direction (X direction in FIG. 4) of the separators 85 is formed at the bottom of the supporting portion 7.

The terminal 10 is a terminal for measuring the cell voltage, which enables a contact with the output terminal 86 of the separator 85. Each of the terminals 10 is fixed to the control unit 2 with its end 11a of a base portion thereof (one end of the terminal) 11 being embedded in the case portion 5 of the control unit 2. Also, the terminal 10 is electrically connected to the voltage detection circuit of the control unit 2.

Moreover, each of the terminals 10 includes a pair of spring arms (elastic portions) 12 and 12, and a connection portion (the other end of the terminal) 13. Each of the pair of spring arms 12 and 12 has substantially an arch shape and extends in the downward direction from a lower periphery of the base portion 11 so as to oppose the other, and the connection portion 13 is connected to the lower end of the spring arms 12 and 12. The spring arms 12 and 12 connect the base portion 11 of the terminal 10 with the connection portion 13 so as to be relatively displaceable in the horizontal direction (X and Y directions in FIG. 4) and the vertical direction (Z direction in FIG. 4) within their elastic range. The connection portion 13 is located below the supporting portion 7, and has a structure to hold the output terminal 86 from the both sides thereof. Accordingly, when the connection portion 13 is connected to the output terminal 86, the connection portion 13 is hardly separated from the output terminal 86.

As shown in FIGS. 3 and 4, the holder 20 is attached to the bottom surface of the supporting portion 7 of the terminal cover 3, and in this embodiment, four holders 20 are attached to one of the terminal covers 3. The holder 20 may be made using an insulating material, and configured by a slider portion 21 and an arm portion 22. The slider portion 21 is located below the supporting portion 7, and the arm portion 22 extends from the slider portion 21 in the direction approaching to the control unit 2 so as to be located below the terminal accommodating space 6. At the upper surface of the slider portion 21, a fitting convex portion 23 which extends in the stacking direction of the separators 85 (X direction in FIG. 4) is formed. Also, three elongated holes 24 are formed which penetrate through the lower surface of the slider portion 21 and the upper surface of the fitting convex portion 23 and extend in the stacking direction of the separators 85 (X direction in FIG. 4).

The holder 20 may be attached to the supporting portion 7 in an inseparable manner by engaging the fitting convex portion 23 of the slider portion 21 with the fitting concave portion 8 of the supporting portion 7 and by inserting three bolts 25 into the bottom surface of the slider portion 21 through the corresponding elongated hole 24 and screwing to the supporting portion 7. Also, the holder 20 is slidably attached with respect to the supporting portion 7 in the stacking direction of the separators 85 (X direction in FIG. 4) within the range in which the bolt 25 is relatively movable along the elongated hole 24. In other words, the holder 20 is movably attached in the stacking direction of the separators 85 with respect to the control unit 2.

A number of slits 26 which penetrate through the upper and the lower surfaces of the arm portion 22 are disposed at the end portion side of the arm portion 22 closer to the control unit 2 with predetermined intervals in the X direction in FIG. 4. The connection portion 13 of the terminal 10 is inserted into the corresponding slit 26. In this manner, the connection portions 13 of the terminals 10 are maintained to be in a state separated from each other. In other words, the holder 20 maintains the connection portions 13 of the terminals 10 in a state separated from each other in order to prevent an electrical short of the terminals 10.

In the cell voltage measuring device 1 having the above-mentioned configuration, all of the holders 20 are attached to the bottom surface of the supporting portion 7 prior to being placed on the top plate 81 of the fuel cell cover 80. At that time, the connection portion 13 of the terminal 10 is inserted into the respective slit 26 of the holder 20. Then, the cell voltage measuring device 1 is placed above the top plate 81 of the fuel cell cover 80, and after positioning the corresponding connection portions 13 of the terminals 10 above the output terminal 86 of each of the separators 85 protruding from the terminal opening 82 of the top plate, the cell voltage measuring device is pushed downwardly. In this manner, each of the output terminals 86 first makes contact with the corresponding connection portion 13, and is then held by the connection portions 13 to complete an electrical connection of the device when the cell voltage measuring device 1 is further pushed downwardly. After this, the cell voltage measuring device 1 is fixed to the fuel cell cover 80 using bolts 9. As explained above, in the cell voltage measuring device 1, the terminal 10 can be readily connected to the corresponding output terminal 86 without the necessity of carrying out a connection operation using a harness. Also, the size and weight of the device may be decreased since no harness is used.

Moreover, there is a case in which the position of the output terminal 86 of each of the separators 85 is slightly shifted from the predetermined position due to manufacturing errors of the separator 85 or errors generated when the stack is assembled. According to the present invention, however, since the spring arms 12 are provided for each of the terminals 10 of the cell voltage measuring device 1, the positional errors can be corrected by the elastic deformation of the spring arms 12 of the terminal 10 in accordance with the position of the output terminal 86 to be connected when the cell voltage measuring device 1 is attached to the fuel cell cover 80. Accordingly, the connection portion 13 of the terminal 10 may be firmly connected to the output terminal 86 of the separator 85.

Furthermore, since all of the terminals 10 are covered by the terminal cover 3 and by the holder 20 in the cell voltage measuring device 1 according to the embodiment of the present invention, it is possible to prevent the terminal 10 from contacting with water. Also, since foreign materials have difficulty adhering to the terminal 10, it becomes possible to prevent electrical short of the terminals 10. Accordingly, the reliability in measuring the cell voltage of the device can be improved. Note that the holder 20 functions as a cover for the terminal 10 in this embodiment.

In addition, since the separator 85 thermally expands when the stack generates heat and increases the temperature due to power generation, the position of the separator 85, i.e., the position of the output terminal 86, may be slightly shifted in the stacking direction of the separators 85 (X direction in FIG. 4) from its position at a lower temperature prior to generating power. At that time, the position of the connection portion 13 of the terminal 10 connected to the output terminal 86 is also shifted being inseparable with the output terminal 86. On the other hand, since the end 11a of the base portion 11 of the terminal 10 is fixed to the control unit 2 and the control unit 2 is fixed to the fuel cell cover 80, the base portion 11 and the connection portion 13 of the terminal 10 are relatively displaced with respect to the stacking direction of the separators 85. In such a case, according to the cell voltage measuring device 1 of the present invention, the displacement can be absorbed by the elastic deformation of the spring arms 12 provided for each of the terminals 10. As a result, it becomes possible to prevent an excessive load from being applied to the base portion 11 of the terminal 10, and hence, it becomes possible to prevent the terminal 10 from being damaged.

Also, at that time, the holder 20 which engages the connection portion 13 of the terminal 10 with the slit 26 slides in the same direction as the moving direction of the connection portion 13 with respect to the supporting portion 7 of the terminal cover 3 in order to secure the connection portion 13 to move with the output terminal 86. Since the holder 20 maintains the state in which the connection portions 13 are separated from each other during the displacement of the connection portions 13 with the output terminals 86, electrical shorts among the terminals 10 can be prevented. Accordingly the reliability in measuring the cell voltage of the device can be improved.

Figure 5:
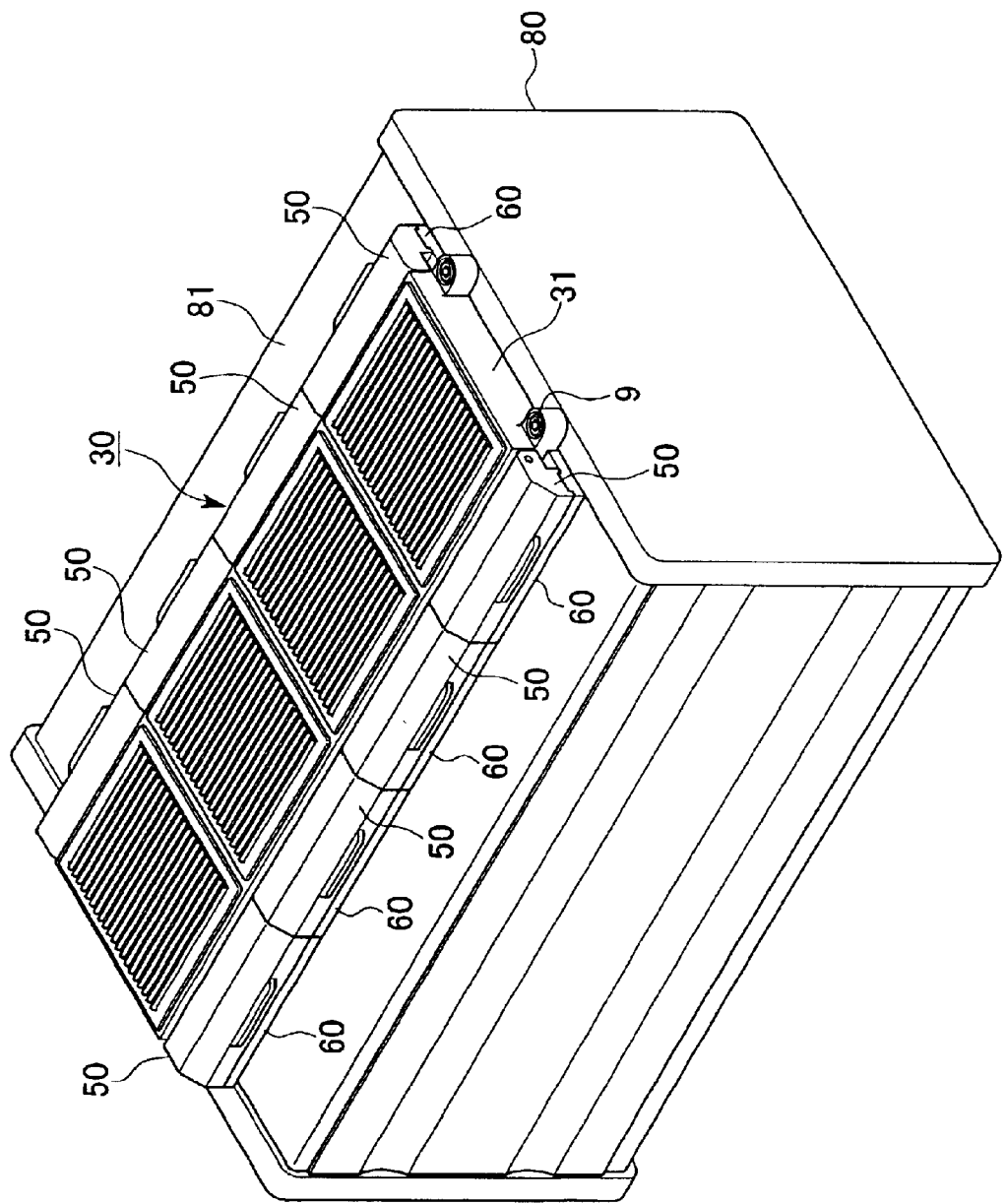
FIG. 5 is a diagram showing a perspective view of an assembly of a cell voltage measuring device according to the second embodiment of the present invention and a fuel cell provided therewith.
Figure 6:
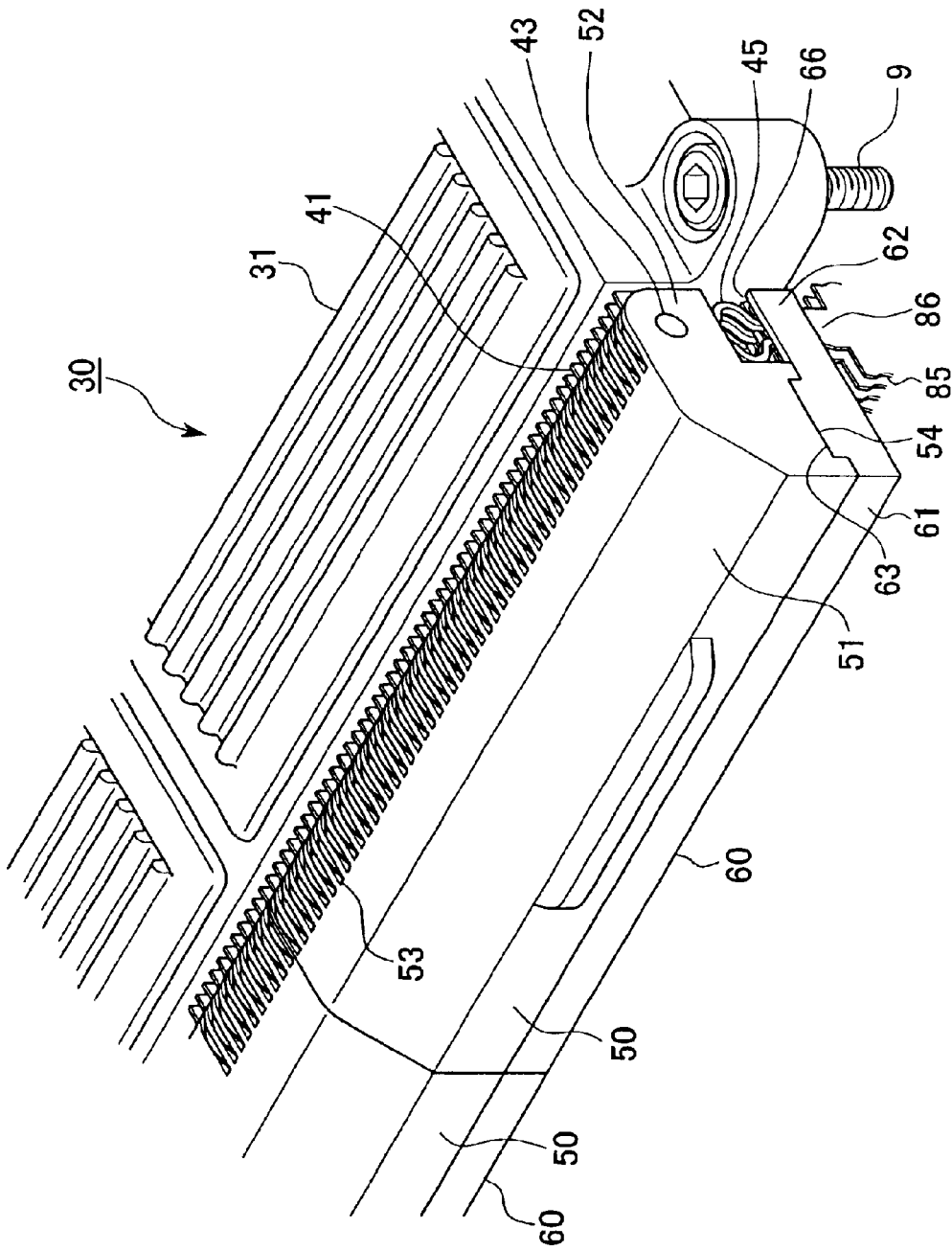
FIG. 6 is a diagram showing an enlarged perspective view of the appearance of main parts of the cell voltage measuring device according to the second embodiment of the present invention.
Figure 7:
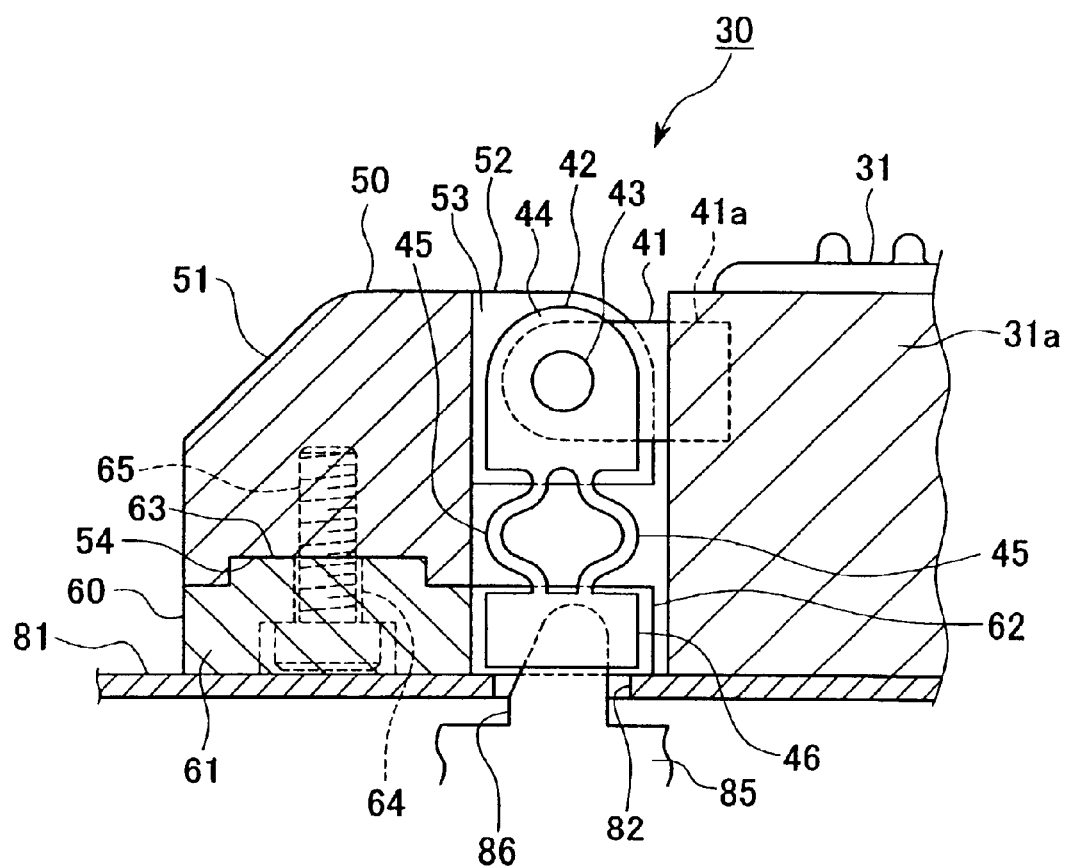
FIG. 7 is a diagram showing a cross-sectional view of the cell voltage measuring device according to the second embodiment of the present invention.
Figure 8:
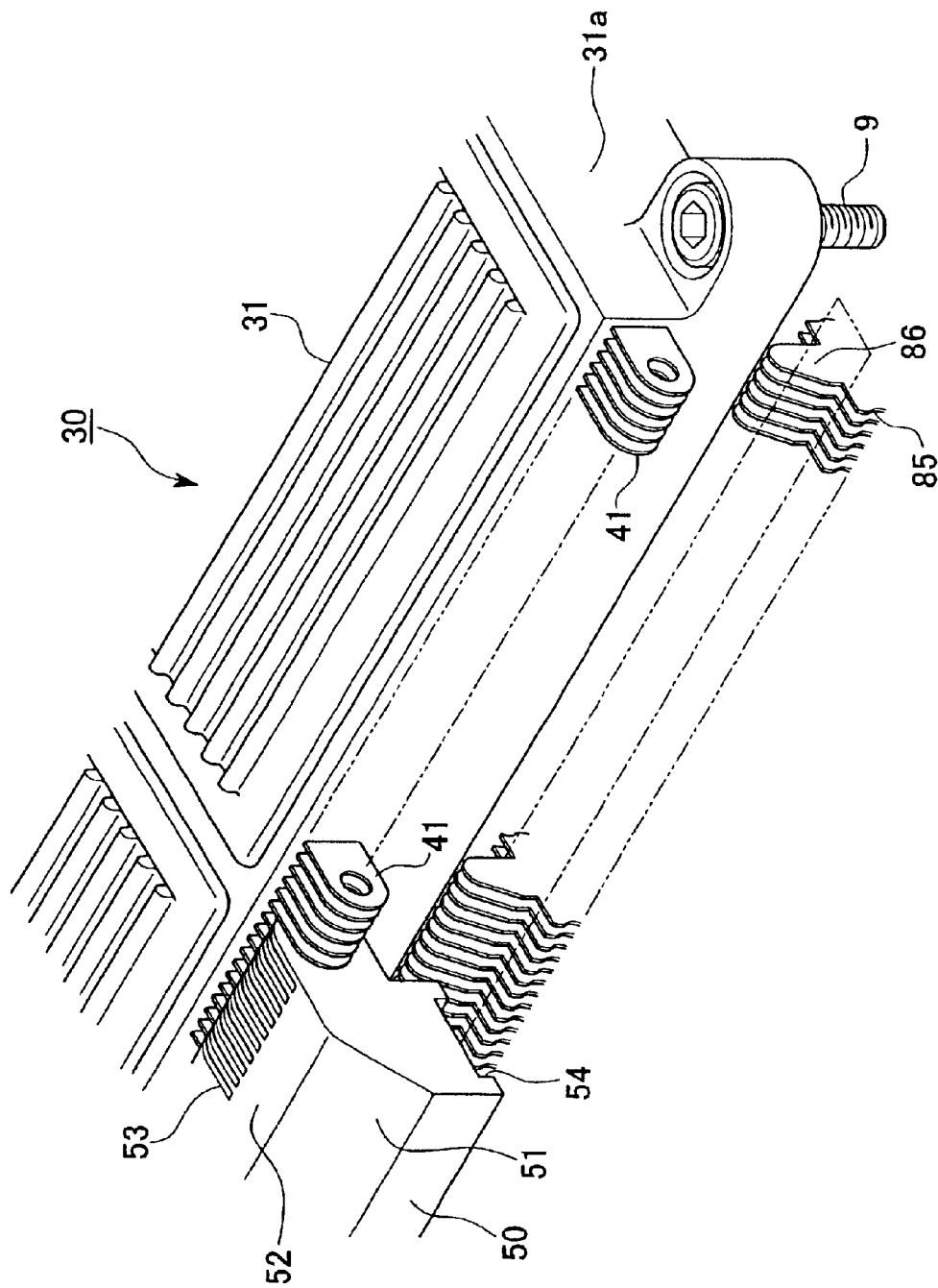
FIGS. 8 through 10 are diagrams showing an enlarged view of a part of the cell voltage measuring device according to the second embodiment of the present invention.
Figure 9:
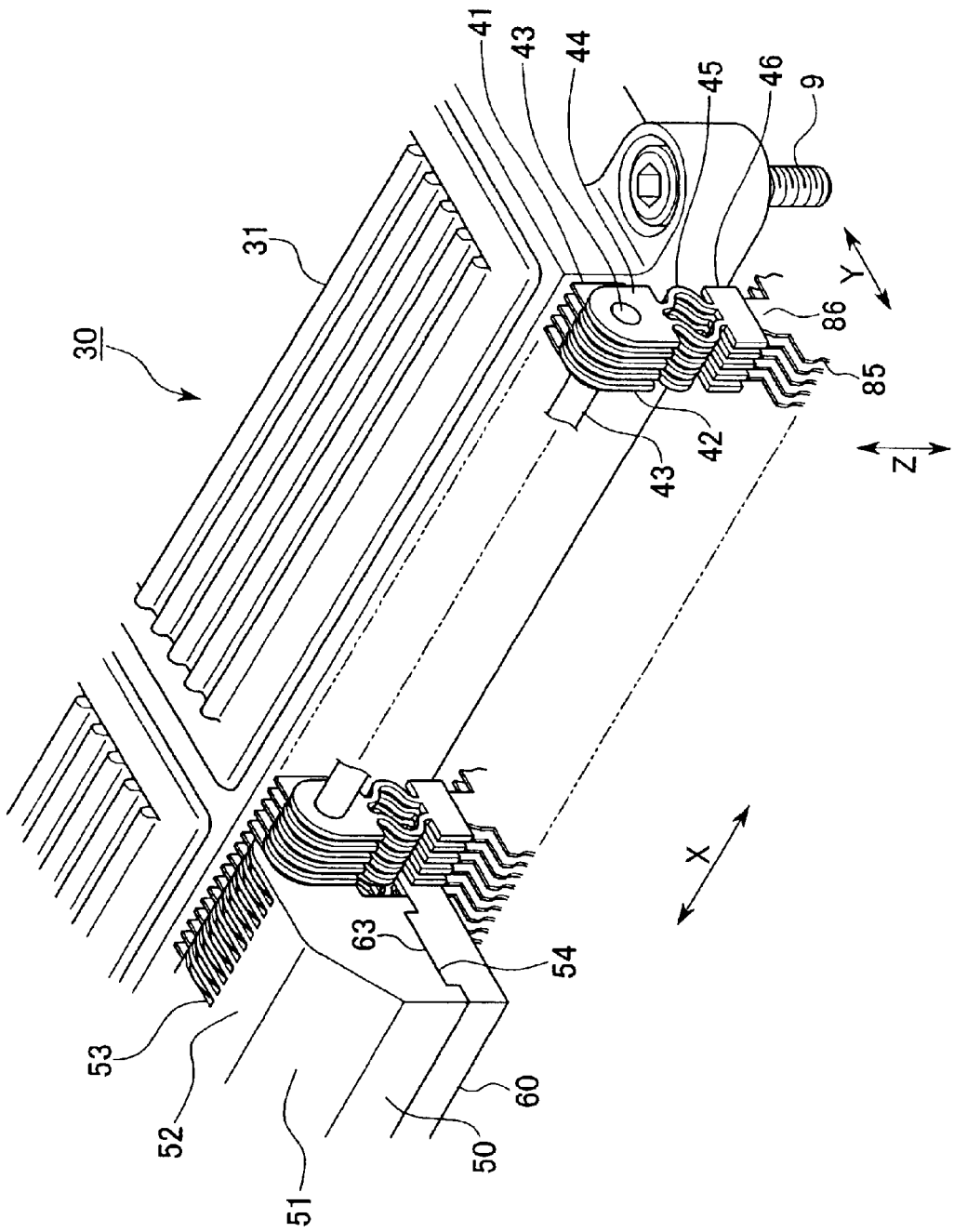
Figure 10:
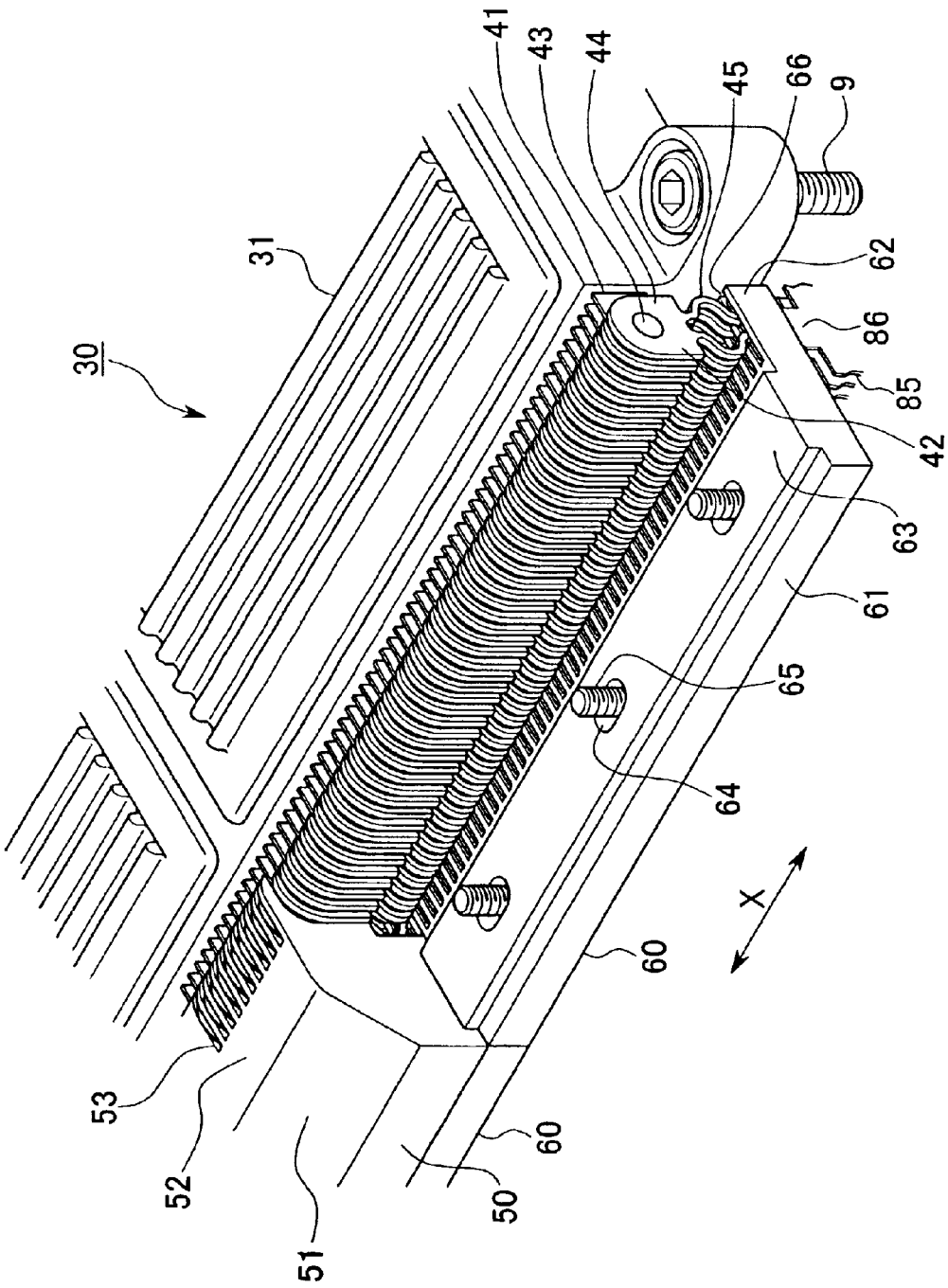
Figure 11:
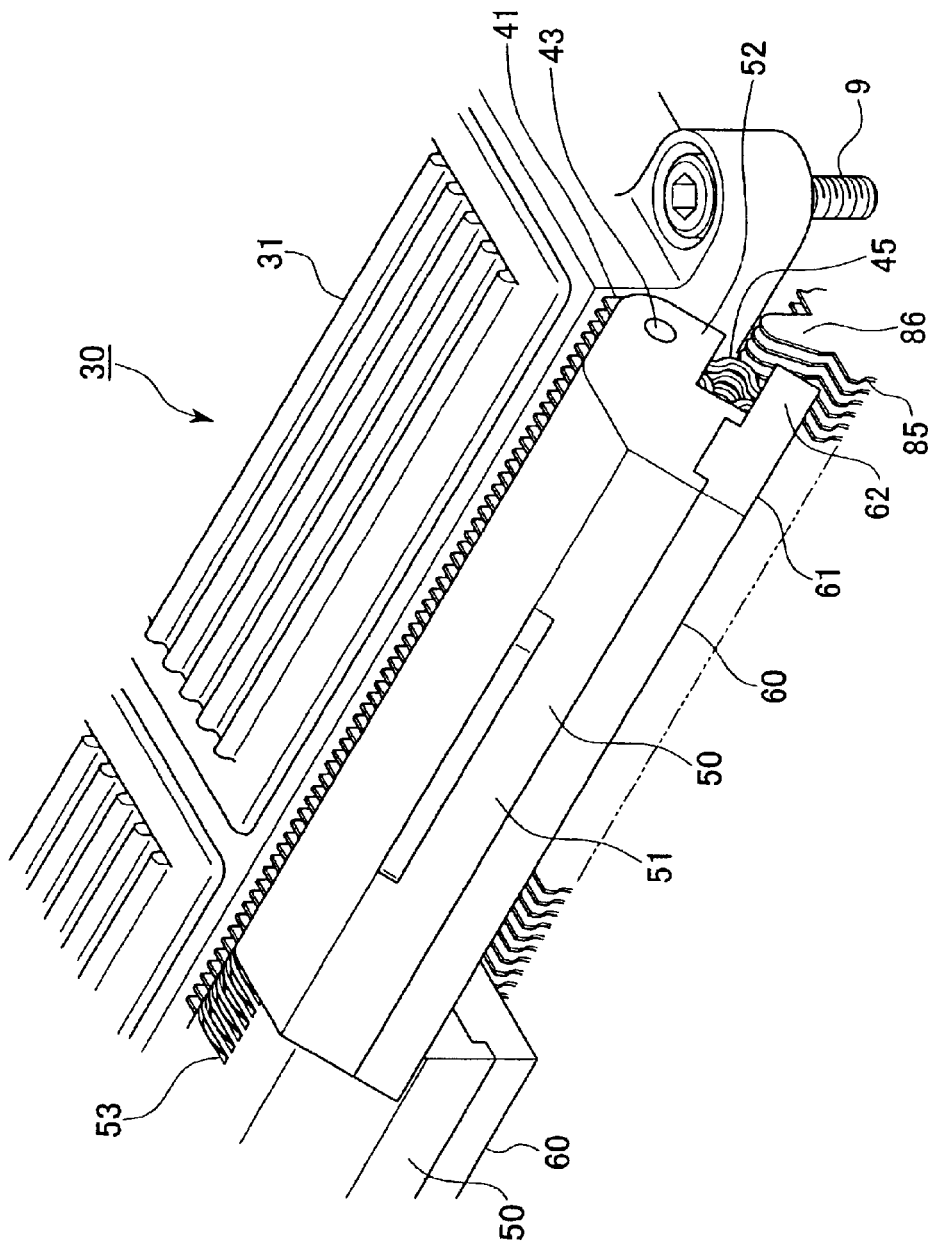
FIG. 11 is a diagram for explaining a set-up procedure for the cell voltage measuring device according to the second embodiment of the present invention.
Figure 12:
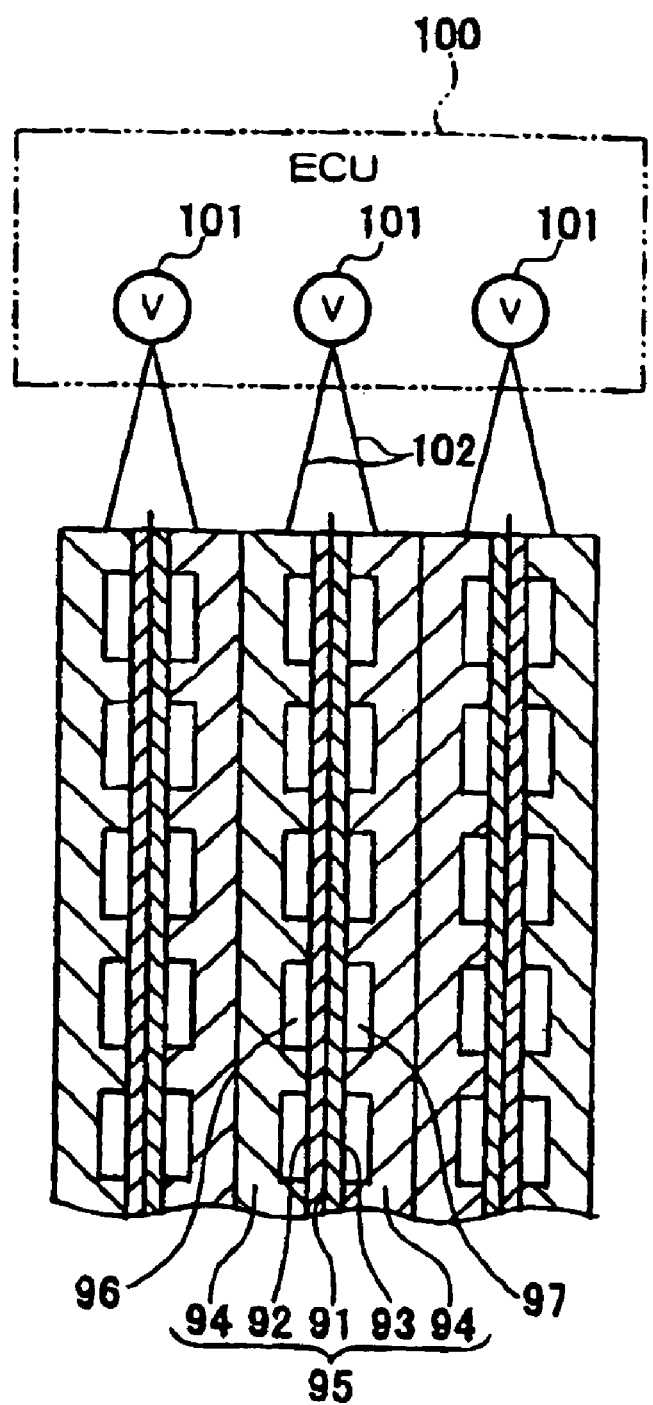
FIG. 12 is a diagram showing a cross-sectional view of a conventional fuel cell.

Second Embodiment:

Next, the second embodiment according to the present invention will be described with reference to FIGS. 5 through 11. FIG. 5 is a diagram showing a perspective view of an assembly of a cell voltage measuring device 30 placed on the fuel cell cover 80 in which the stack (fuel cell) is accommodated. FIG. 6 is a diagram showing an enlarged perspective view of the appearance of the main parts of the cell voltage measuring device 30. FIG. 7 is a diagram showing a cross-sectional view of the cell voltage measuring device 30 shown in FIG. 6. FIGS. 8 through 10 are diagrams showing an enlarged view of a part of the cell voltage measuring device 30. FIG. 11 is a diagram for explaining a set-up procedure for the cell voltage measuring device 30.

As shown in FIG. 5, the cell voltage measuring device 30 is provided on the top plate 81 of the fuel cell cover 80 which accommodates the stack inside thereof. Since the fuel cell cover 80, the stack, and the separators used in this embodiment are the same as the ones in the first embodiment, the same numerals are used for parts indicating the same elements, and explanation thereof will be omitted.

As shown in FIG. 7, the cell voltage measuring device 30 includes a control unit (a voltage measuring means) 31, a number of first terminals 41, second terminals 42, eight terminal covers 50, and holders 60. The control unit 31 is disposed between the terminal openings 82 and 82 at the top plate 81 of the fuel cell cover 80. The first terminals 41 are fixed to the two side portions of the control unit 31. Each of the second terminals 42 are rotatably attached to the corresponding first terminal 41. The terminal covers 50 are disposed at the two side portions of the control unit 31, and are rotatable together with the second terminals 42. The holder 60 is attached to the lower end portion of each of the terminal covers 50. The control unit 31 includes a case portion 31a made of an insulating material in which a voltage detection circuit for detecting the voltage of each cell, etc., is accommodated.

The first terminal 41 forms a pair with the second terminal 42 as a terminal for measuring cell voltage which can be contacted the output terminal 86 of the separator 85.

Each of the first terminals 41, as shown in FIGS. 7 and 8, is fixed to the control unit 31 with its end 41a being embedded in a case portion 31a of the control unit 31. Also, the first terminal 41 is electrically connected to the above-mentioned voltage detection circuit of the control unit 31.

As shown in FIGS. 9 and 10, the second terminal 42, which forms a pair with the first terminal 41, is rotatably supported with respect to the first terminal 41 via a shaft 43, and is always maintained in an electrically connected state with the respective first terminal 41. Also, the second terminals 42 are electrically insulated with respect to the each other. Moreover, as shown in FIGS. 7 and 9, the second terminal 42 includes a coupling portion (one end of the second terminal) 44, a pair of spring arms (elastic portions) 45 and 45, and a connection portion (the other end of the second terminal) 46. The coupling portion 44 makes contact with the first terminal 41. Each of the pair of spring arms 45 and 45 has substantially an arch shape and extends in the downward direction from a lower periphery of the coupling portion 44 so as to oppose the other. The connection portion 46 is connected to the lower end of the spring arms 45 and 45. The spring arms 45 and 45 in turn connect the coupling portion 44 of the second terminal 42 with the connection portion 46 so as to be relatively displaceable in the horizontal direction (X and Y directions in FIG. 9) and the vertical direction (Z direction in FIG. 9) within their elastic range. The connection portion 46 has a structure to hold the output terminal 86 of the separator 85 from the two sides thereof. Accordingly, when the connection portion 46 is connected to the output terminal 86, the connection portion 46 is hardly separated from the output terminal 86.

Four terminal covers 50 are attached to each side portion of the control unit 31, and the second terminals 42 are divided into four groups so as to correspond to the number of the terminal covers 50 at a side portion of the control device 31. Also, each of the second terminals 42 which belongs to the same group is coupled to the terminal cover 50 so as to rotate in a synchronized manner with respect to each other by maintaining the same posture.

The terminal cover 50 includes a supporting portion 51 which is located at the outside of the second terminals 42, and arm portions 52 which extend from the upper portion of the supporting portion 51 in the direction approaching to the control unit 31. The pair of the first terminal 41 and the second terminal 42, which are electrically connected, is inserted into the corresponding slit 53 provided with the arm portions 52, and the coupling portion 44 of each of the second terminals 42 is fixed to the arm portion 52. Accordingly, when the terminal cover 50 is rotated around the shaft 43, all of the second terminals 42 which are coupled to the terminal cover 50 rotate together with the terminal cover 50 as shown in FIG. 11. Also, the lower surface of the supporting portion 51 of the terminal cover 50 is located above the connection portion 46 of the second terminal 42, and a fitting concave portion 54 which extends in the stacking direction of the separators 85 (X direction in FIG. 9) is formed at the bottom of the supporting portion 51.

The holders 60 are attached to the bottom surface of the supporting portion 51 of the terminal cover 50, and in this embodiment, the holders 60 are made of an insulating material. Each of the holders 60 may include a slider portion 61 and an arm portion 62. The slider portion 61 is located below the supporting portion 51, and the arm portion 62 extends from the slider portion 61 in the direction approaching to the control unit 31 so as to be located below the arm portion 52 of the terminal cover 50. At the upper surface of the slider portion 61, a fitting convex portion 63 which extends in the stacking direction of the separators 85 (X direction in FIGS. 9 and 10) is formed. Also, three elongated holes 64 are formed which penetrate through the lower surface of the slider portion 61 and the upper surface of the fitting convex portion 63 and elongate in the stacking direction of the separators 85 (X direction in FIG. 4).

The holder 60 may be attached to the supporting portion 51 in an inseparable manner by engaging the fitting convex portion 63 of the slider portion 61 with the fitting concave portion 54 of the supporting portion 51 and by inserting three bolts 65 into the bottom surface of the slider portion 61 through the corresponding elongated hole 64 and screwing to the supporting portion 51. Also, the holder 60 is slidably attached with respect to the supporting portion 51 in the stacking direction of the separators 85 (X direction in FIGS. 9 and 10) within the range in which the bolt 65 is relatively movable along the elongated hole 64. In other words, the holder 60 is movably attached in the stacking direction of the separators 85 with respect to the control unit 31.

As shown in FIGS. 6, 9, and 10, a number of slits 66 which penetrate through the upper and the lower surfaces of the arm portion 62 are disposed at the end portion side of the arm portion 62 closer to the control unit 31 with predetermined intervals in the X direction. The connection portion 46 of the second terminal 42 is inserted into the corresponding slit 66. In this manner, the connection portions 46 of the second terminals 42 are maintained in a state electrically separated from each other. In other words, the holder 60 maintains the connection portions 46 of the second terminals 42 in a state separating from each other in order to prevent an electrical short of the second terminals 42.

In the cell voltage measuring device 30 having the above-mentioned configuration, all of the holders 60 are attached to the bottom surface of the supporting portion 51 prior to placing on the top plate 81 of the fuel cell cover 80. At that time, the connection portion 46 of the second terminal 42 is inserted into the respective slit 66 of the holder 60. Also, the arm portions 62 of all the holders 60 are separated from the control unit 31 by rotating all of the terminal covers 50 in the upward direction.

Then, the cell voltage measuring device 30 prepared in the above-mentioned manner is placed on the top plated 81 of the fuel cell cover 80 between the terminal openings 82 and 82, and the control unit 31 is fixed to the fuel cell cover 80 using the bolts 9.

After this, each of the terminal covers 50 is rotated around the shaft 43 in the downward direction. Then, the second terminals 42 and the holders 60 are rotated in the downward direction together with the terminal cover 50, and each of the second terminals 42 makes contact with the corresponding output terminal 86 of the separator 85 from the side direction. When the terminal cover 50 is further rotated, the output terminal 86 is held by the connection portions 46 of the second terminal 42, and an electrical connection thereof is completed. As explained above, in the cell voltage measuring device 30, the second terminal 42 can be readily connected to the corresponding output terminal 86 without the necessity of carrying out a connection operation using a harness. Also, the size and weight of the device may be decreased since no harness is used.

Moreover, there is a case in which the position of the output terminal 86 of each of the separators 85 is slightly shifted from the predetermined normal position due to manufacturing errors of the separator 85 or errors generated when the stack is assembled. According to the cell voltage measuring device 30 of the present invention, however, since the spring arms 45 are provided for each of the second terminals 42, the positional errors can be corrected by the elastic deformation of the spring arms 45 of the second terminal 42 in accordance with the position of the output terminal 86 to be connected when the terminal cover 50 is rotated to connect the second terminal 42 to the output terminal 86. Accordingly, the connection portion 46 of the second terminal 42 may be firmly connected to the output terminal 86 of the separator 85.

Furthermore, since the second terminals 42 are covered by the terminal cover 50 and by the holder 60 in the cell voltage measuring device 30 according to the second embodiment of the present invention, it is possible to prevent the second terminal 42 from contacting with water. Also, since foreign materials have difficulty attaching to the second terminal 42, it becomes possible to prevent electrical shorts of the second terminals 42. Accordingly, the reliability in detecting the cell voltage of the device can be improved. Note that the holder 60 functions as a cover for the second terminal 42 in this embodiment.

In addition, since the separator 85 thermally expands when the stack generates heat and increases the temperature due to power generation, the position of the separator 85, i.e., the position of the output terminal 86, may be slightly shifted in the stacking direction of the separators 85 (X direction in FIG. 9) from its position at a lower temperature prior to generating power. At that time, the position of the connection portion 46 of the second terminal 42 connected to the output terminal 86 is also shifted being inseparable with the output terminal 86. On the other hand, since the coupling portion 44 of the second terminal 42 is connected to the first terminal 41 fixed to the control unit 31, and the control unit 31 is fixed to the fuel cell cover 80, the coupling portion 44 and the connection portion 46 of the second terminal 42 is relatively displaced with respect to the stacking direction of the separators 85. In such a case, the displacement can be absorbed by the elastic deformation of the spring arms 45 provided for each of the second terminals 42 according to the cell voltage measuring device 30 of the present invention. As a result, it becomes possible to prevent an excessive load from being applied to the coupling portion 44 of the second terminal 42 and the first terminal 31, and hence, it becomes possible to prevent the first and second terminals 41 and 42 from being damaged.

Also, at that time the holder 60 which engages the connection portions 46 of the second terminal 46 with the slits 66, slides in the same direction as the moving direction of the connection portion 46 with respect to the supporting portion 51 of the terminal cover 50 in order to secure the connection portion 46 to move with the output terminal 86. Since the holder 60 maintains the state in which the connection portions 46 are separated from each other during the displacement of the connection portions 46 with the output terminals 86, electrical shorts among the second terminals 42 can be prevented. Accordingly the reliability in measuring the cell voltage of the device can be improved.

Other Embodiments:

The present invention is not limited to the embodiments described above. For example, although the holder is movably attached to the terminal cover in the stacking direction of the separators, it is possible to attach the holder to, for instance, the control unit in the first or second embodiment so as to be movable in the stacking direction of the separators.

Also, although the holder is attached to the terminal cover so as to add terminal cover function to the holder, it is possible not to add the cover function to the holder when the holder is not attached to the terminal cover. In such a case, it is possible, for instance, to cover the holder together with the terminal using the terminal cover.

Moreover, the shape of the elastic portion of the terminal is not limited to substantially the arch shape such as the spring arms described in the above-mentioned embodiments, and various shapes may be adapted for the elastic portion of the terminal.

Having thus described exemplary embodiments of the invention, it will be apparent that various alterations, modifications, and improvements will readily occur to those skilled in the art. Such alterations, modifications, and improvements, though not expressly described above, are nonetheless intended and implied to be within the spirit and scope of the invention. Accordingly, the foregoing discussion is intended to be illustrative only; the invention is limited and defined only by the following claims and equivalents thereto.

What is claimed is:

1. A cell voltage detector for a fuel cell comprising:
   terminals that are brought into abutment with separators for said fuel cell;
   a voltage detecting means for detecting the cell voltage of said fuel cell through said terminals;
   a fuel cell cover at least partially encompassing said fuel cell;
   a terminal holder holding one end of said respective terminals and permitting the abutment of said terminals with said separators via a terminal opening formed in said fuel cell cover, said terminal holder having a leg portion that is brought into abutment with the periphery of said terminal opening; and
   a terminal cover retained onto said fuel cell cover, so that said terminal cover is brought into abutment with a head portion of said terminal holder on an inner surface thereof and covers the periphery of said terminal opening.

2. The cell voltage detector for fuel cell according to claim 1, wherein said fuel cell cover has a plurality of said terminal openings;
   wherein said terminal cover covers said plurality of terminal openings; and
   wherein said voltage detecting means is disposed between said plurality of terminal openings which are covered with said terminal cover.

3. The cell voltage detector for fuel cell according to claim 1, wherein said terminal holder has at least one elastic body disposed on at least one of a distal end of said leg portion and a distal end of said head portion.

4. The cell voltage detector for fuel cell according to claim 1, wherein said terminal holder has a pair of said leg portions disposed in such a manner as to straddle said terminal opening, and
   wherein said terminal holder holds the one end of said terminals between said pair of leg portions.

5. A cell voltage detector for a fuel cell comprising:
   terminals that are brought into abutment with separators for said fuel cell;
   a voltage detecting unit electrically connected to said terminals for detecting the cell voltage of said fuel cell;
   a fuel cell cover at least partially encompassing said fuel cell;
   a terminal holder holding one end of said respective terminals and permitting the abutment of said terminals with said separators via a terminal opening formed in said fuel cell cover; and
   a terminal cover retained onto said fuel cell cover,
   wherein said terminal holder is interposed between said fuel cell cover and said terminal cover while being brought into abutment with said fuel cell cover and said terminal cover.

6. The cell voltage detector for fuel cell according to claim 5, wherein said fuel cell cover has a plurality of said terminal openings;
   wherein said terminal cover covers said plurality of terminal openings; and wherein said voltage detecting unit is disposed between said plurality of terminal openings which are covered with said terminal cover.

7. The cell voltage detector for fuel cell according to claim 5, further comprising:
at least one elastic body disposed at least either between said terminal holder and said fuel cell cover or between said terminal holder and said terminal cover.

8. The cell voltage detector for fuel cell according to claim 5, wherein said terminal holder has a pair of leg portions disposed in such a manner as to straddle said terminal opening, and wherein said terminal holder holds the one end of said terminals between said pair of leg portions In the Specification.

9. A cell voltage detector for a fuel cell comprising:
a plurality of terminals that are brought into abutment with a plurality of separators of said fuel cell;
a voltage detecting means for detecting the cell voltage of said fuel cell through said plurality of terminals;
a fuel cell cover at least partially encompassing said fuel cell;
a terminal holder holding one end of said plurality of terminals and permitting the abutment of said plurality of terminals with said plurality of separators via a terminal opening formed in said fuel cell cover, said terminal holder having a leg portion that is brought into abutment with a periphery of said terminal opening; and
a terminal cover retained onto said fuel cell cover, so that said terminal cover is brought into abutment with a head portion of said terminal holder on an inner surface thereof and covers the periphery of said terminal opening.

10. A cell voltage detector for a fuel cell comprising:
a plurality of terminals that are brought into abutment with a plurality of separators of said fuel cell;
a voltage detecting unit electrically connected to said plurality of terminals for detecting the cell voltage of said fuel cell;
a fuel cell cover at least partially encompassing said fuel cell;
a terminal holder holding one end of said plurality of terminals and permitting the abutment of said plurality of terminals with said plurality of separators via a terminal opening formed in said fuel cell cover; and
a terminal cover retained onto said fuel cell cover, wherein said terminal holder is interposed between said fuel cell cover and said terminal cover while being brought into abutment with said fuel cell cover and said terminal cover.

11. The cell voltage detector for fuel cell according to claim 1, wherein the separators are formed from a sheet metal.

12. The cell voltage detector for fuel cell according to claim 1, wherein the separators have output terminals protruding upwardly from the separators.

13. The cell voltage detector for fuel cell according to claim 12, wherein the output terminals of the separators are disposed to make a plurality of lines on a surface of the fuel cell.

14. The cell voltage detector for fuel cell according to claim 5, wherein the separators are formed from a sheet metal.

15. The cell voltage detector for fuel cell according to claim 5, wherein the separators have output terminals protruding upwardly from the separators.

16. The cell voltage detector for fuel cell according to claim 15, wherein the output terminals of the separators are disposed to make a plurality of lines on a surface of the fuel cell.

17. A cell voltage measuring device for a fuel cell according to claim 1, wherein said voltage measuring unit is disposed on or above a stack, said stack being formed by stacking a plurality of fuel cells, wherein said stack is placed substantially horizontal with respect to a stacking direction of said plurality of fuel cells.

18. A cell voltage measuring device for a fuel cell according to claim 7, wherein said voltage measuring unit is disposed on or above a stack, said stack being formed by stacking a plurality of fuel cells, wherein said stack is placed substantially horizontal with respect to a stacking direction of said plurality of fuel cells.

19. A cell voltage measuring device for a fuel cell according to claim 1, wherein the elastic portion is integrally formed with one of said first end and said second end.

20. A cell voltage measuring device for a fuel cell according to claim 7, wherein the elastic portion is integrally formed with one of said first end and said second end.

21. A cell voltage measuring device for a fuel cell according to claim 1, wherein the elastic portion is a separate component from one of said first end and said second end.

22. A cell voltage measuring device for a fuel cell according to claim 7, wherein the elastic portion is a separate component from one of said first end and said second end.

23. A cell voltage measuring device for a fuel cell, comprising:
a terminal member to be connected to a separator of said fuel cell, said terminal member including a first end and a second end; and
a voltage measuring unit which measures a cell voltage of said fuel cell through said terminal member, wherein
the first end of said terminal member is fixed to said voltage measuring unit, and the second end of said terminal member contacts said separator, and an elastic portion comprising a spring member is provided between the first end and the second end of said terminal member.

24. A cell voltage measuring device for a fuel cell, comprising:
a terminal member to be connected to a separator of said fuel cell, said terminal member comprising a first terminal portion and a second terminal portion, and said second terminal portion including a first end and a second end; and
a voltage measuring unit which measures a cell voltage of said fuel cell through said terminal, wherein
said first terminal portion is fixed to said voltage measuring unit, and
the first end of said second terminal portion is rotatably supported by said first terminal portion, and the second end of said second terminal portion contacts said separator, and an elastic portion comprising a spring member is provided between the first end and the second end of said second terminal portion.

25. A cell voltage measuring device for a fuel cell, comprising:
a terminal member to be connected to a separator of said fuel cell, said terminal member including a first end, a second end and an elastic member provided between the first end and the second end; and
a voltage measuring unit which measures cell voltage of said fuel cell through said terminal member, wherein
the first end of said terminal member is fixed to said voltage measuring unit, and the second end of said terminal member makes contact with said separator.

* * * * *